United States Patent
Akomer et al.

(10) Patent No.: US 7,855,088 B2
(45) Date of Patent: Dec. 21, 2010

(54) METHOD FOR MANUFACTURING INTEGRATED CIRCUITS BY GUARDBANDING DIE REGIONS

(75) Inventors: Errol P. Akomer, Plano, TX (US); James Bright, Rockwall, TX (US); Mohammad Nikpour, Plano, TX (US); Jason Tervooren, Allen, TX (US); Kyle Flessner, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 481 days.

(21) Appl. No.: 11/614,432

(22) Filed: Dec. 21, 2006

(65) Prior Publication Data

US 2008/0153184 A1 Jun. 26, 2008

(51) Int. Cl.
*G01R 31/26* (2006.01)
*H01L 21/66* (2006.01)

(52) U.S. Cl. ............... 438/16; 438/14; 438/460; 257/E21.521

(58) Field of Classification Search ............ 438/14–18, 438/460; 257/E21.521
See application file for complete search history.

(56) References Cited

U.S. PATENT DOCUMENTS

| | | | |
|---|---|---|---|
| 4,417,347 A * | 11/1983 | Muka et al. ............ | 373/158 |
| 6,650,130 B1 * | 11/2003 | Kash et al. ............ | 324/752 |
| 7,062,081 B2 * | 6/2006 | Shimoda et al. ........ | 382/149 |
| 7,369,236 B1 * | 5/2008 | Sali et al. ............. | 356/394 |
| 2003/0062487 A1 * | 4/2003 | Hiroi et al. ........... | 250/492.2 |
| 2004/0121496 A1 * | 6/2004 | Brankner et al. ....... | 438/14 |
| 2005/0008218 A1 * | 1/2005 | O'Dell et al. .......... | 382/145 |
| 2006/0133661 A1 * | 6/2006 | Takeda et al. .......... | 382/149 |
| 2008/0049125 A1 * | 2/2008 | Subbotin .............. | 348/241 |

FOREIGN PATENT DOCUMENTS

JP 2003046220 A * 2/2003

OTHER PUBLICATIONS

English machine translation of Jaoanese patent JP2003046220A, Method and Device for Inspecting Substrate and Method of Manufacturing Substrate, Feb. 14, 2003.*

* cited by examiner

*Primary Examiner*—Charles D Garber
*Assistant Examiner*—Angel Roman
(74) *Attorney, Agent, or Firm*—Warren L. Franz; Wade J. Brady, III; Frederick J. Telecky, Jr.

(57) ABSTRACT

The invention provides a method for manufacturing an integrated circuit. The method, in one embodiment, includes inspecting a semiconductor wafer including a plurality of die for a defect, the inspecting providing an image of the semiconductor wafer including the defect. The method further includes identifying an area of the semiconductor wafer from the image, wherein the identified area encompasses at least those die including any portion of the defect, and dicing the semiconductor wafer into individual die. The die defined by the identified area, in this embodiment, are then discarded.

12 Claims, 4 Drawing Sheets

METHOD FOR MANUFACTURING INTEGRATED CIRCUITS BY GUARDBANDING DIE REGIONS

TECHNICAL FIELD OF THE INVENTION

The invention is directed, in general, to a method for manufacturing integrated circuits and, more specifically, to a method for manufacturing integrated circuits by guardbanding die regions.

BACKGROUND OF THE INVENTION

The fabrication of semiconductor integrated circuits (ICs) is an extremely complex process that involves several hundred or more operations. ICs are fabricated by selectively implanting impurities into and applying conductive and insulative layers onto a semiconductor substrate. Semiconductor ICs (die) are not manufactured individually but rather as an assembly of a hundred or more die on a "wafer," which is then diced up to produce the individual die.

Increasing production yield is an ongoing problem in the manufacture of semiconductor die. Because of various defects that can occur in the fabrication of a wafer, a significant number of die have to be discarded for one reason or another, thereby decreasing the percentage yield per wafer and driving up the cost of the individual die. Defects are typically caused by foreign particles, minute scratches, and other imperfections introduced during photoresist, photomask, and diffusing operations subjected to the wafer.

Electrical probe testing is a commonly used method for determining the impact of the defects on the ICs themselves. For instance, the wafers containing the die may be subjected to the electrical probe test to ascertain which die fail and which ones pass. In many cases, not all wafers are tested, and thus a number of defective die can be shipped from the manufacturer to clients. Moreover, the electrical probe testing process cannot detect all failures, which also leads to the shipping of defective die.

Accordingly, what is needed in the art is a process for manufacturing an IC that reduces the number of defective die that are ultimately shipped from the manufacturer to the customer, as well as reduces the number of die that undergo field failure due to reliability problems caused by defects that are ultimately shipped.

SUMMARY OF THE INVENTION

To address the above-discussed deficiencies of the prior art, the invention provides a method for manufacturing an integrated circuit. The method, in one embodiment, includes inspecting a semiconductor wafer including a plurality of die regions for a defect, the inspecting providing an image of the semiconductor wafer including the defect. The method further includes identifying an area of the semiconductor wafer from the image, wherein the identified area encompasses at least those die regions including any portion of the defect, and dicing the semiconductor wafer into individual die. The die defined by the identified area, in this embodiment, are then discarded.

The method, in an alternative embodiment, includes: (1) forming semiconductor features on or in a layer of a semiconductor wafer, wherein the semiconductor wafer includes a plurality of die regions, (2) obtaining an image of the layer of the semiconductor wafer using an optical inspection tool, (3) examining the image to detect for defects, (4) circumscribing each detected defect with a line on the image, each line defining an area of the semiconductor wafer and encompassing at least those die regions including any portion of each defect, and (5) dicing the semiconductor wafer into individual die, wherein the die defined by the area are discarded.

BRIEF DESCRIPTION OF THE DRAWINGS

For a more complete understanding of the invention, reference is now made to the following descriptions taken in conjunction with the accompanying drawings, in which.

DETAILED DESCRIPTION

Figure 1:
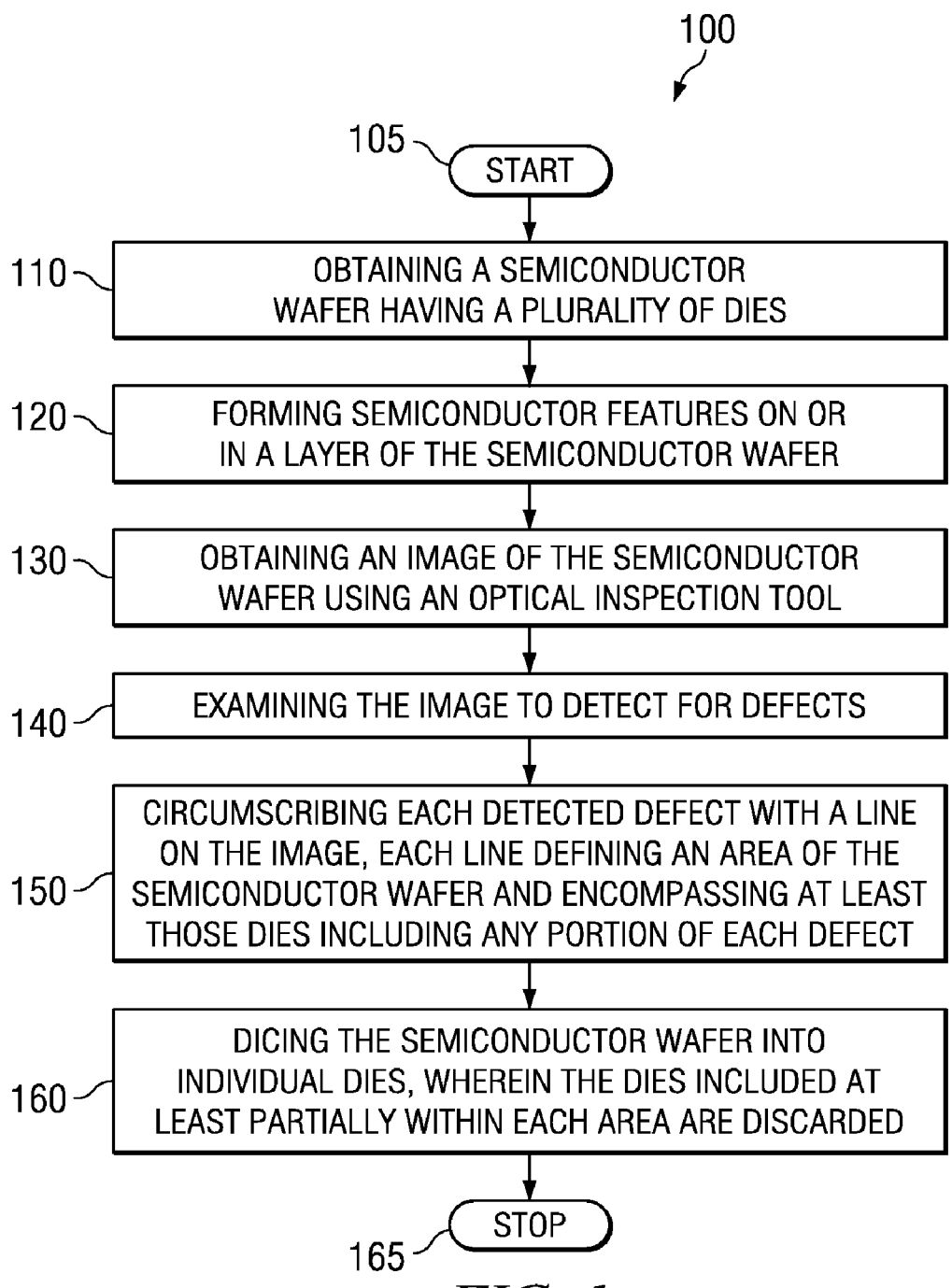
FIG. 1 illustrates a flow diagram indicating an embodiment of a method for manufacturing an IC in accordance with the invention.

The invention is based, at least in part, on the acknowledgment that faulty die, as well as die that that undergo field failure due to reliability problems caused by defects, continue to be shipped from IC manufacturers to their customers. The inventors acknowledge that the practice of sending these less than reliable die needs addressing. The inventors further recognize that the practice is costly and troublesome to their customers.

Given the foregoing acknowledgements, the inventors recognize that defects, particularly macro scale defects, are far more problematic than conventional electrical probe tests indicate. For instance, the inventors recognize that the conventional electrical probe tests often pass certain die that may be materially affected by such defects. These materially affected die will then ultimately be shipped to the customers.

Accordingly, the inventors have developed a method for manufacturing an IC that addresses the foregoing acknowledgements and recognitions. For example, the inventors have developed a method that identifies (e.g., guardbands) an area on a semiconductor wafer that has had a defect at any one of a number of different manufacturing log points. The guardbanded area, which contains at least those die regions containing any portion of the defect, will be carried through the manufacturing process until the time that the wafer need be diced into its individual die. At this point, the guardbanded area, or areas in certain instances, may be used to discard these faulty, unreliable, potentially faulty or potentially unreliable die. Because most macro defects previously could not be detected after the wafer was manufactured, the in-line inspection tool combined with the auto-guardbanding provides for containment of the defective die regions.

The present method has been greatly enhanced by the development of reliable, accurate and high throughput optical inspection tools. For instance, certain ones of today's optical inspection tools are capable of quickly imaging and detecting defects down to about 50 microns in size. These optical inspection tools may also be capable of inspecting up to about 250 semiconductor wafers of about 200 mm in size per hour. Even more 150 mm could be fully inspected per hour. This degree of defect detection and throughput allows the manufacturer to inspect, and thus obtain an image, of every semiconductor wafer at many different stages of manufacture. These images may then be used to conduct the aforementioned guardbanding.

One such optical inspection tool is the EAGLEview optical inspection module that may be obtained through Microtronic, Inc., having a principal place of business of P.O. Box 3359, Edgartown, Mass. 02539. The EAGLEview optical inspection module is configured to be added to one of Microtronic's other inspection and sorting systems. Other optical inspection tools that might be used may be obtained by other similar companies, such as KLA Tencore, Inc., of California, Inspex, Inc., of Massachusetts, etc.

FIG. 1 illustrates a flow diagram 100 indicating an embodiment of a method for manufacturing an IC in accordance with the invention. The flow diagram 100 begins in a start step 105. Thereafter, in a step 110, a wafer having a plurality of die regions is obtained. The wafer, at this stage of the flow, may be a bare wafer or a wafer having one or more semiconductor features already formed thereon.

Thereafter, in a step 120, one or more additional semiconductor features are formed on or in a layer of the wafer. The step of forming the one or more additional semiconductor features may include almost any process used to form any feature. For example, the step 120 might include forming one or more interconnect features on or in the wafer. Additionally, the step 120 might include patterning one or more photoresist features on or in the wafer. Step 120 might include other process steps, or a collection of different process steps.

After step 120, in a step 130, an image of the layer of the wafer is obtained using an optical inspection tool. For example, the EAGLEview optical inspection module could be used to obtain the image. The image, in this embodiment, might be saved as a computer file. For example, in one embodiment the image is saved as a JPEG file. Other types of images could, nonetheless, also be used.

In a step 140, the image obtained in the step 130 may be examined for one or more possible defects. For instance, an automated program, such as the EAGLEview in one embodiment, may be used to perform a macro inspection and automatically detect the potential defects. In one embodiment, these potential defects are found by comparing the image obtained in the step 130 to an image of a defect free wafer (e.g., golden wafer). While the examination of the image for potential defects is discussed as an automated step, those skilled in the art understand that is could also be performed manually.

Thereafter, in a step 150, each potential defect detected may be reviewed to determine whether it is an actual defect, and then circumscribed with a line on the image. The step of reviewing each detected potential defect is, in one embodiment, a manual step. The manual review provides flexibility and allows "intelligent" examination of the potential defects. Nevertheless, other non-manual (e.g., automatic) steps might also be used.

Each line circumscribed around each defect defines an area of the wafer. Moreover, each line circumscribed around each defect should encompass at least those die regions including any portion of each defect. In one embodiment, each defect is surrounded by a box. For instance, an individual could use a computer program to drag and drop a box of the appropriate size over each of the defects. The box, in another embodiment, might encompass the die regions including any portion of the defect and a row of buffer die surrounding those die regions including any portion of the defect. The buffer die are selected to provide a degree of comfort, such that any die conceivably affected by the defect is flagged.

The process of circumscribing the defects with a line, in one embodiment, guardbands those die. For example, the image with the circumscribed line may be saved as an electronic file, for example a guardband file. This guardband file may be saved on an accessible server, so as to be used at a point of dicing the wafer. Moreover, the ability to circumscribe the defects on the image alleviates the need for wafer layout information to be known. For example, an algorithm may use the center and a known notch in the wafer to calculate the area to guardband.

The process of steps 120 thru 150 may be repeated any number of times on a given wafer. For instance, steps 120 thru 150 could be repeated at every different metal level layer of the semiconductor wafer, among others. Obviously, the more times steps 120 thru 150 are repeated, the more images taken, and thus the more likely every defect will be detected. In certain known embodiments, the wafer is subjected to steps 120 thru 150 at least 12 different times at 12 different log points. This repeating of steps 120 thru 150 ultimately also provides a "virtual map" of the wafer, which is very beneficial.

After completing steps 120 thru 150, the wafer is diced into individual die in a step 160. In this step, the die defined by the areas are discarded. The term discarded, as used throughout this document, means that the die are not shipped as usable product to customers. The die may be used internally for testing, shipped to customers for testing, destroyed or otherwise used, but would not generally be shipped as usable product to customers.

In one embodiment, an algorithm associated with the wafer dicing tool is configured to determine whether a guardband file was generated for a given wafer. The algorithm might go to the accessible server where the guardband files are maintained for this information. This algorithm may then assist in discarding the die defined by the area, as defined by the guardband file. This process may be an automatic process, as opposed to a manual process.

Those skilled in the art understand the various different algorithms that might be used to accomplish the aforementioned discarding. Those skilled in the art also appreciate the different places where the algorithm may be maintained. In one embodiment, the algorithm is contained within software directly on the wafer dicing tool. In an alternative embodiment, the algorithm is contained within software on a tool separate from but related to the wafer dicing tool.

The process might end in a stop step 165. Alternatively, the process might return to an earlier step, or the beginning for that matter, and begin again.

Figure 2:
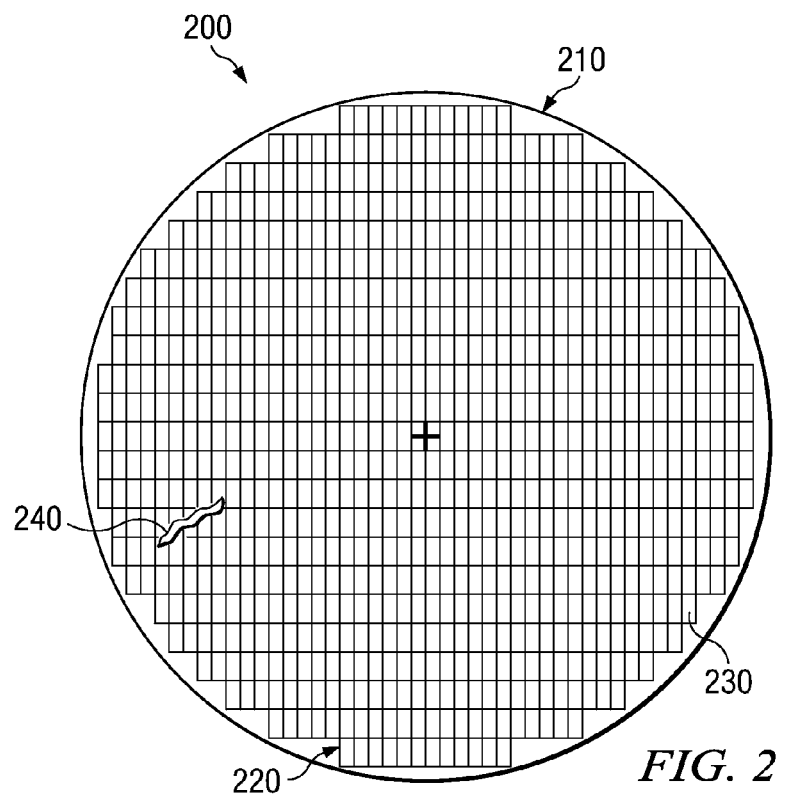
FIGS. 2-7 illustrate another embodiment of a method for manufacturing an IC in accordance with the invention.

FIGS. 2-7 illustrate another embodiment of a method for manufacturing an IC in accordance with the invention. FIG. 2 illustrates an image 200 of an IC at an initial stage of manufacture. The image 200 of the IC includes a semiconductor wafer 210. The wafer 210 may be any currently known or hereafter discovered wafer. In the embodiment of FIG. 2, the wafer 210 includes a notch 220 and one or more die regions 230. The notch 220, as those skilled in the art expect, may be used along with the center of the wafer to coordinate various different features on the wafer 210, including the location of specific die regions 230, defects 240, etc.

The one or more die regions 230 represent die boundaries for different die on the wafer 210. These die boundaries may ultimately be the scribe lines of which the wafer 210 is diced into individual die. Moreover, the die regions 230 may or may not be visible to the human eye, whether or not using a magnification means. The number of die regions 230 on a given wafer 210 generally varies based upon the wafer 210 size and the desired size for each individual die region 230.

The wafer 210 of FIG. 2 includes one or more semiconductor features thereon or therein. For instance, the wafer 210 of FIG. 2 is a wafer that has already had semiconductor features formed thereon or in, as compared to a blank wafer obtained directly from the wafer manufacturer. Nevertheless, any wafer 210 capable of having one or more defects thereon or therein could be used at this stage of manufacture.

The wafer 210, in the embodiment shown, includes a first defect 240 at this first layer. The first defect 240 may comprise a macro defect, among other defects. Macro defect, as used in this embodiment, includes defects of about 50 microns or larger. Generally, these macro defects extend over more than one die region 230 and comprise foreign particles, minute scratches, or other imperfections introduced during the manufacturing process (e.g., photoresist, photomask, and diffusing operations, among other processes). The first defect 240, in the given embodiment, is a scratch that extends over at least 8 die regions 230, if not more.

The embodiment of FIG. 2 illustrates the image 200 as might be obtained from an optical inspection tool. For instance, the image 200 of FIG. 2 might be obtained from the aforementioned EAGLEview inspection module, such as discussed above with respect to step 130. The image 200 of FIG. 2, however, might comprise a different image from a different inspection tool and remain within the bounds of the invention.

Figure 3:
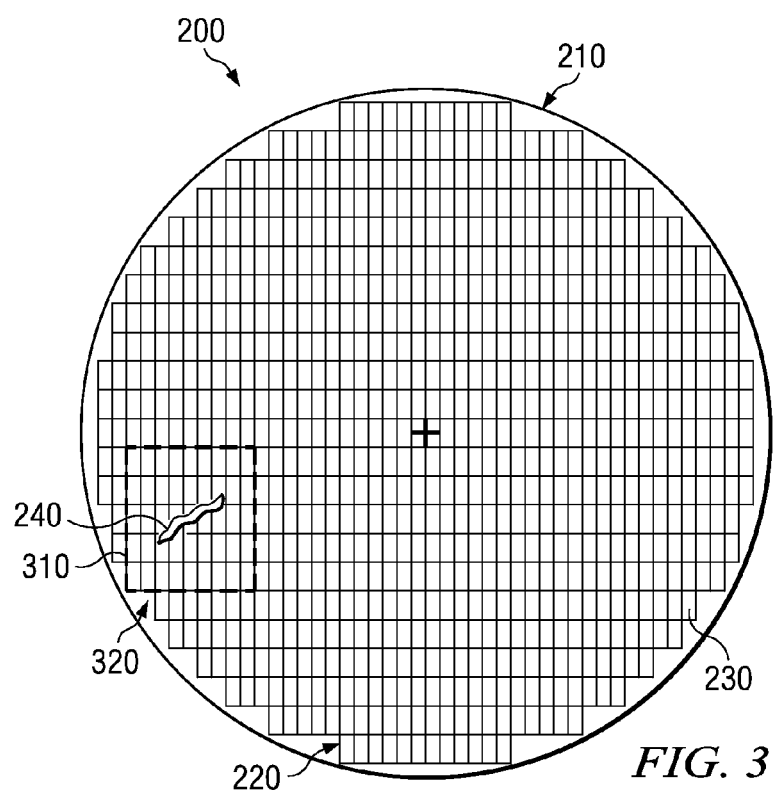

FIG. 3 illustrates the image 200 of FIG. 2 after circumscribing each defect (e.g., only one defect 240 in this layer) with a line 310. The line 310, in accordance with the invention, should circumscribe at least those die regions 230 including any portion of each defect (e.g., the first defect 240). The line 310 further defines an area 320 of the wafer 210.

In the given embodiment, the line 310 defining the area 320 is superimposed on the image 200. For instance, the area 320 is a box that has been transposed on the image 200 to encompass at least those die regions including any portion of the first defect 240. In the shown embodiment, the box, and thus area 320, further includes a row of buffer die regions that surround those die regions at least partially including the defect. As previously mentioned, the buffer die regions provide a high degree of comfortability that the first defect 240 is contained.

The image 200 having the area 320 transposed thereon may then be saved as a guardband file. The guardband file, in this instance, may be used to indicate that an area of the wafer 210 includes die regions 230 having at least one defect. The guardband file may also be used to indicate a location of the area 320 (e.g., defect), wherein the location of the area 320 is known relative to the center of the wafer 210 and the notch 220.

The guardband file may be stored in many locations. Nevertheless, in one embodiment it is stored in an easy to access location. For instance, it could be stored in a location easy to access by a subsequent algorithm. Other locations could also exist.

Figure 4:
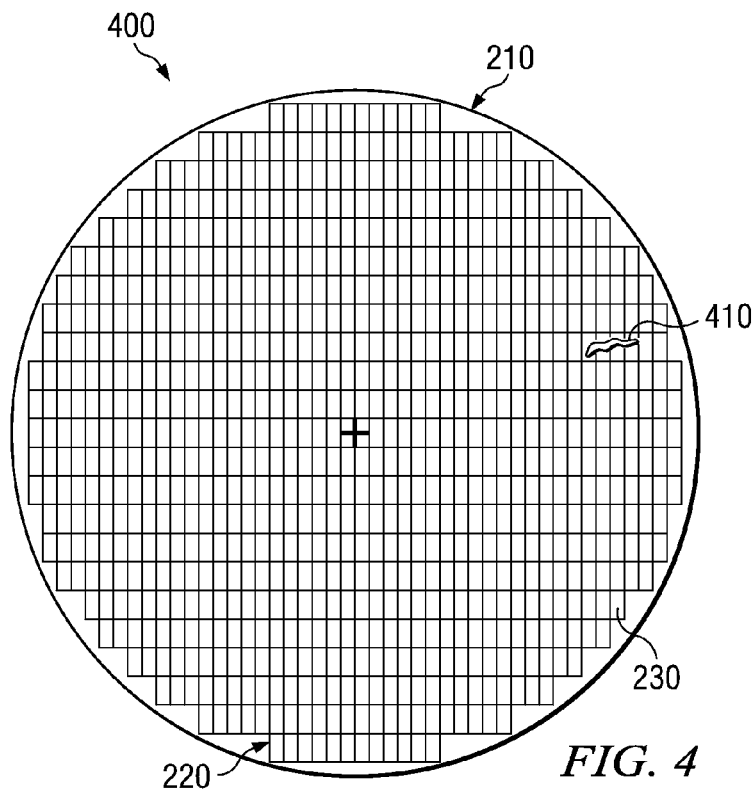

FIG. 4 illustrates a second image 400 of the IC after forming additional semiconductor features on a second layer of the wafer 210. The additional semiconductor features may comprise similar or different features as those contained within the image 200 of the wafer 210. For instance, the image 200 may have illustrated the IC at metal level one, wherein the second image 400 illustrates the IC at metal level two.

Notwithstanding, the second image 400 illustrates that the IC includes a second defect 410 located at a different location on the wafer 210. The second defect 410 is again a scratch. However, the second defect 410 could comprise any other type of defect and remain within the purview of the invention.

This second image 400 may have been obtained using the same optical inspection tool as that used to obtain the image 200. Alternatively, a different optical inspection tool may have been used. For instance, depending on the stage of manufacture of the IC, a different optical inspection tool might be needed or desired.

Figure 5:
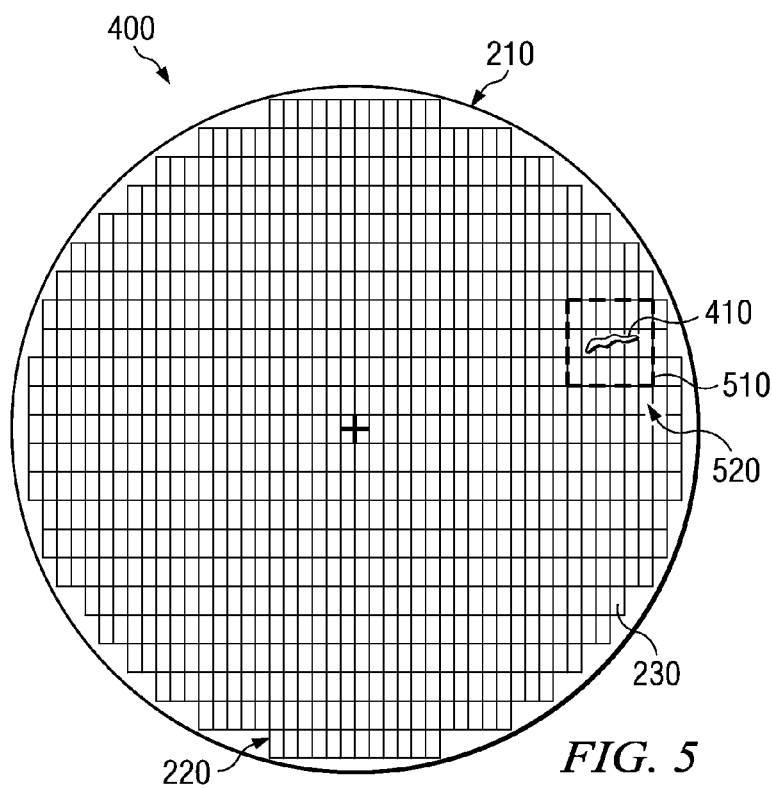

FIG. 5 illustrates the second image 400 of FIG. 4 after examining the image 400 to detect for the second defect 410, and circumscribing the second defect 410 with a line 510. The line 510, similar to the line 310, defines an area 520 of the wafer 210 and encompasses at least those die regions 230 including any portion of the second defect 410. In this embodiment, the second defect 410 extends across four die regions 230, but the area 520 defined by the line 510 encompasses 18 die regions 230. Again, the difference between the four die regions 230 and 18 die regions 230 represents a safety factor.

The image 400 having the line 510 overlayed thereon may then be saved as a second guardband file. The second guardband file may be used for the same purposes as the first guardband file. The second guardband file will, in most embodiments, be saved in the same location as the first guardband file.

Figure 6:
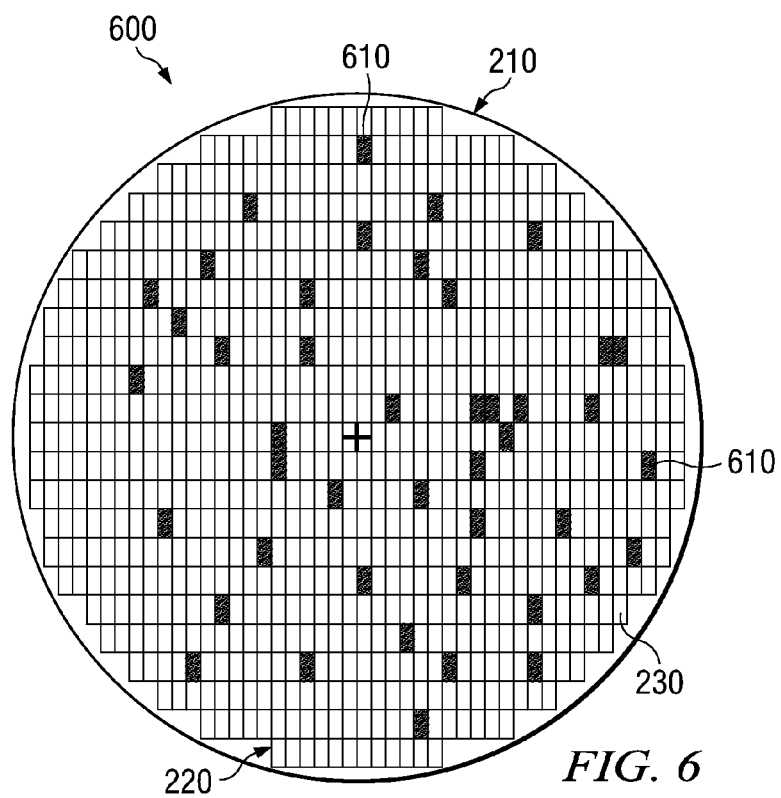

FIG. 6 illustrates an image 600 of the IC after subjecting the wafer 210 to an electrical probe test. The electrical probe test, which may be conventional, is used to determine those die regions 230 that fail one or more electrical tests. Those die regions 230 that fail one or more electrical tests are known to be faulty die regions 610, as represented by the inked-out die regions.

Those skilled in the art understand and appreciate the electrical probe test process. For example, those skilled in the art understand that electrical probes may be brought into contact with various points on the wafer 210. Thereafter, a number of electrical tests, including tests for resistance, faults, shorts, etc. may be conducted.

Figure 7:
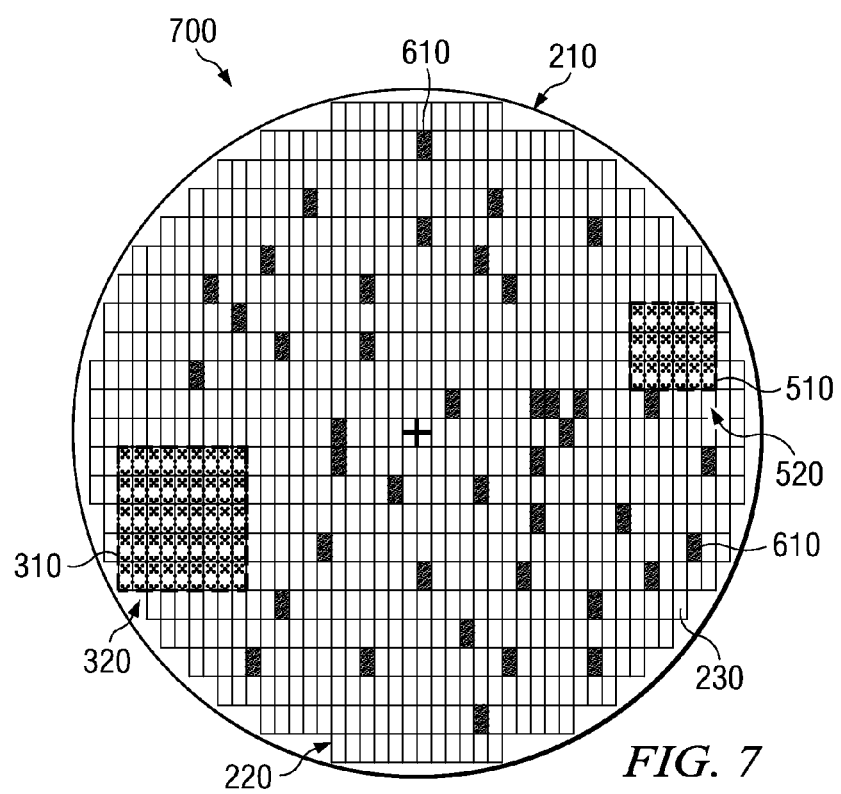

FIG. 7 illustrates an image 700 of a wafer map of the IC indicating those faulty die regions 610, as well as those die regions 230 contained within the areas 320, 520 defined by the lines 310, 510. The information included within the image 700 may then be used to dice the wafer 210 into individual die. The information may further be used to discard those faulty die regions 610 and those die regions 230 contained within the areas 320, 520 defined by the lines 310, 510. Accordingly, these discarded die will not be shipped as usable product to customers.

The process for discarding the faulty die regions 610 and those die regions 230 contained within the areas 320, 520 defined by the lines 310, 510 may be an automatic process. For instance, an algorithm could be used to first ascertain whether a guardband file exists for the wafer 210. If a guardband file does exist, then the algorithm could then be used to overlay the information contained within the guardband file (e.g., the first and second guardband files in this embodiment) on the wafer map. This wafer map could also include those faulty die regions 610 observed by the electrical probe test process.

The wafer map highlighting those die regions 320 contained with the areas 320, 520 defined by the lines 310, 510, as well as those faulty die regions 610 might then be used to assist the wafer dicing tool with dicing the wafer 210 into its individual die. The wafer dicing tool, or a feature associated therewith, could then discard any die from the faulty die regions 610 and those die from the areas 320, 520 defined by the lines 310, 510.

If no guardband file exists, the algorithm would not overlay guardband information on the wafer map. Accordingly, the wafer map might only include the faulty die regions 610 identified by the electrical probe test. Thereafter, the wafer map highlighting those faulty die regions 610 might then be used to assist the wafer dicing tool with dicing the wafer 210 into its individual die. The wafer dicing tool, or a feature associated therewith, could then discard any die from the faulty die regions 610.

It should be noted that not all embodiments require the electrical probe test to be performed. Accordingly, certain embodiments exist wherein the wafer map includes information from a guardband file and no information from the electrical probe test. Likewise, other embodiments exist wherein the wafer map includes information from the electrical probe test and no information from a guardband file. Even other embodiments exist (e.g., those embodiments wherein no electrical probe test was performed and no guardband file exists or was generated) wherein the wafer map does not include information from the electrical probe test or a guardband file.

Those skilled in the art to which the invention relates will appreciate that other and further additions, deletions, substitutions and modifications may be made to the described embodiments without departing from the scope of the invention.

What is claimed is:

1. A method for manufacturing an integrated circuit, comprising:
    forming semiconductor features on or in a layer of a semiconductor wafer, wherein the semiconductor wafer includes a plurality of die regions;
    obtaining an image of the layer of the semiconductor wafer using an optical inspection tool;
    performing a macro inspection of the image using an automated program to detect a defect that extends over more than one die region;
    circumscribing the detected defect by marking an area of the image defined by defective die regions including any portion of the detected defect and buffer die regions adjacent to the defective die regions; and
    dicing the semiconductor wafer into individual die, using the marked area to identify the die diced from the marked area.

2. The method of claim 1, wherein the detected defect is circumscribed by marking the area of the image with the defective die regions and a border of at least one buffer die surrounding the defective die regions.

3. The method of claim 1, further including forming semiconductor features on or in a second layer of a semiconductor wafer; obtaining a second image of the second layer of the semiconductor wafer using the optical inspection tool; performing a macro inspection of the second image using the automated program to detect a second defect that extends over more than one die region; and circumscribing the detected second defect by a second area of the second image defined by second defective die regions including any portion of the second defect and second buffer die regions adjacent to the second defective die regions; and wherein dicing the semiconductor wafer includes using the marked second area to identify the die diced from the marked second area.

4. The method of claim 1, further including subjecting the semiconductor wafer to an electrical probe test to identify faulty die regions prior to the dicing; and wherein the dicing includes identifying die diced from the identified faulty die regions.

5. The method of claim 1, wherein circumscribing the detected defect by marking includes drawing a line to define a box around the defective and buffer die regions on the image; and saving the marked image as an electronic image file.

6. The method of claim 5, wherein a location of the box is referenced relative to one or more fixed points on the semiconductor wafer; and the location is used to identify the die diced from the marked area.

7. The method of claim 5, wherein an algorithm associated with a wafer dicing tool determines the presence of the electronic file for the semiconductor wafer, and assists in identifying the die diced from the marked area.

8. The method of claim 1, wherein obtaining the image includes obtaining the image using an optical inspection tool capable of detecting defects down to about 50 microns in size and capable of fully inspecting up to about 250 semiconductor wafers of about 200 mm in size per hour.

9. The method of claim 1, wherein the marked image is saved as an electronic file.

10. The method of claim 9, wherein the electronic file is a JPEG format file.

11. The method of claim 1, wherein the defect is detected by comparing the obtained image with an image obtained of the corresponding layer of a defect-free wafer.

12. The method of claim 1, wherein circumscribing the detected defect by marking includes drawing a box on the image, wherein the perimeter of the box corresponds to outermost scribe lines of the defective and buffer die regions defining the area.

* * * * *